US012591047B2

(12) United States Patent
Keyworth et al.

(10) Patent No.: US 12,591,047 B2
(45) Date of Patent: Mar. 31, 2026

(54) OPTICAL SYSTEM FOR LIGHT DETECTION AND RANGING

(71) Applicant: Lumentum Operations LLC, San Jose, CA (US)

(72) Inventors: Barrie P. Keyworth, Ottawa (CA); Eric R. Hegblom, Sunnyvale, CA (US); John Michael Miller, Ottawa (CA)

(73) Assignee: Lumentum Operations LLC, San Jose, CA (US)

( * ) Notice: Subject to any disclaimer, the term of this patent is extended or adjusted under 35 U.S.C. 154(b) by 996 days.

(21) Appl. No.: 17/662,690

(22) Filed: May 10, 2022

(65) Prior Publication Data

US 2023/0258774 A1 Aug. 17, 2023

Related U.S. Application Data

(60) Provisional application No. 63/268,141, filed on Feb. 17, 2022.

(51) Int. Cl.
*G01S 7/48* (2006.01)
*G01S 7/481* (2006.01)
*H01S 5/183* (2006.01)

(52) U.S. Cl.
CPC .......... *G01S 7/4815* (2013.01); *G01S 7/4816* (2013.01); *G01S 7/4817* (2013.01); *H01S 5/18388* (2013.01)

(58) Field of Classification Search
None
See application file for complete search history.

(56) References Cited

U.S. PATENT DOCUMENTS

| | | | |
|---|---|---|---|
| 10,247,547 B2 * | 4/2019 | Thuries | G02B 27/4233 |
| 10,598,771 B2 * | 3/2020 | Wang | G01S 17/894 |
| 10,655,955 B2 * | 5/2020 | Ge | G06T 7/521 |
| 10,818,721 B2 * | 10/2020 | Dutton | G06T 7/579 |
| 10,958,893 B2 * | 3/2021 | Wang | G02B 3/0006 |
| 2019/0273905 A1 * | 9/2019 | Wang | H04N 23/56 |

FOREIGN PATENT DOCUMENTS

WO 2021112997 A1 6/2021

* cited by examiner

*Primary Examiner* — Hovhannes Baghdasaryan
(74) *Attorney, Agent, or Firm* — Harrity & Harrity, LLP

(57) ABSTRACT

In some implementations, an optical system includes an emitter array including a plurality of emitters. The plurality of emitters are arranged in a plurality of channels and the emitter array is configured to illuminate on a per-channel basis. Respective positions of emitters, of the plurality of emitters, of a channel, of the plurality of channels, vary across a width of the channel. The optical system includes a lens to receive light from the emitter array and a diffuser to receive light from the lens. The diffuser is configured to diffuse light along a length of the plurality of channels of the emitter array. The optical system includes a corrective optical element to receive light from the diffuser.

20 Claims, 4 Drawing Sheets

108

Vertical

Horizontal

OPTICAL SYSTEM FOR LIGHT DETECTION AND RANGING

CROSS-REFERENCE TO RELATED APPLICATION

This Patent Application claims priority to U.S. Provisional Patent Application No. 63/268,141, filed on Feb. 17, 2022, and entitled "OPTICS AND EMITTER CONFIGURATION FOR A ONE-DIMENSIONAL ADDRESSABLE VERTICAL CAVITY SURFACE EMITTING LASER ARRAY." The disclosure of the prior Application is considered part of and is incorporated by reference into this Patent Application.

TECHNICAL FIELD

The present disclosure relates generally to light detection and ranging (LIDAR) systems and to an optical system for LIDAR.

BACKGROUND

A LIDAR system may produce an optical beam (e.g., a laser beam or the like), scan the optical beam across a field of view including one or more objects, receive a beam reflected from objects in the field of view, process the received beam, and determine three-dimensional aspects of the one or more objects. For example, the LIDAR system, based on light reflected from objects in the field of view, may construct a point cloud to determine the three-dimensional aspects of the one or more objects. A LIDAR system may include a scanner for scanning an optical beam across a field of view, receiving light reflected from the field of view, and providing the light reflected from the field of view to a receiver for processing.

SUMMARY

In some implementations, a LIDAR system includes a vertical cavity surface emitting laser (VCSEL) array including a plurality of VCSELs. The plurality of VCSELs are arranged in a plurality of channels and the VCSEL array is configured to illuminate on a per-channel basis. Respective positions of VCSELs, of the plurality of VCSELs, of a channel, of the plurality of channels, vary across a width of the channel. The LIDAR system includes a first lens to receive light from the VCSEL array and a diffuser to receive light from the first lens. The diffuser is configured to diffuse light along a length of the plurality of channels of the VCSEL array. The LIDAR system includes an image sensor array configured for line readout. An aspect ratio of the image sensor array is different from an aspect ratio of the VCSEL array. The LIDAR system includes a second lens to provide light to the image sensor array.

In some implementations, an optical system includes an emitter array including a plurality of emitters. The plurality of emitters are arranged in a plurality of channels and the emitter array is configured to illuminate on a per-channel basis. Respective positions of emitters, of the plurality of emitters, of a channel, of the plurality of channels, vary across a width of the channel. The optical system includes a lens to receive light from the emitter array and a diffuser to receive light from the lens. The diffuser is configured to diffuse light along a length of the plurality of channels of the emitter array. The optical system includes a corrective optical element to receive light from the diffuser.

In some implementations, a VCSEL device includes a VCSEL array including a plurality of VCSELs. The plurality of VCSELs are arranged in a plurality of channels and the VCSEL array is configured to illuminate on a per-channel basis. Respective positions of VCSELs, of the plurality of VCSELs, of a channel, of the plurality of channels, vary across a width of the channel.

DETAILED DESCRIPTION

Figure 1:
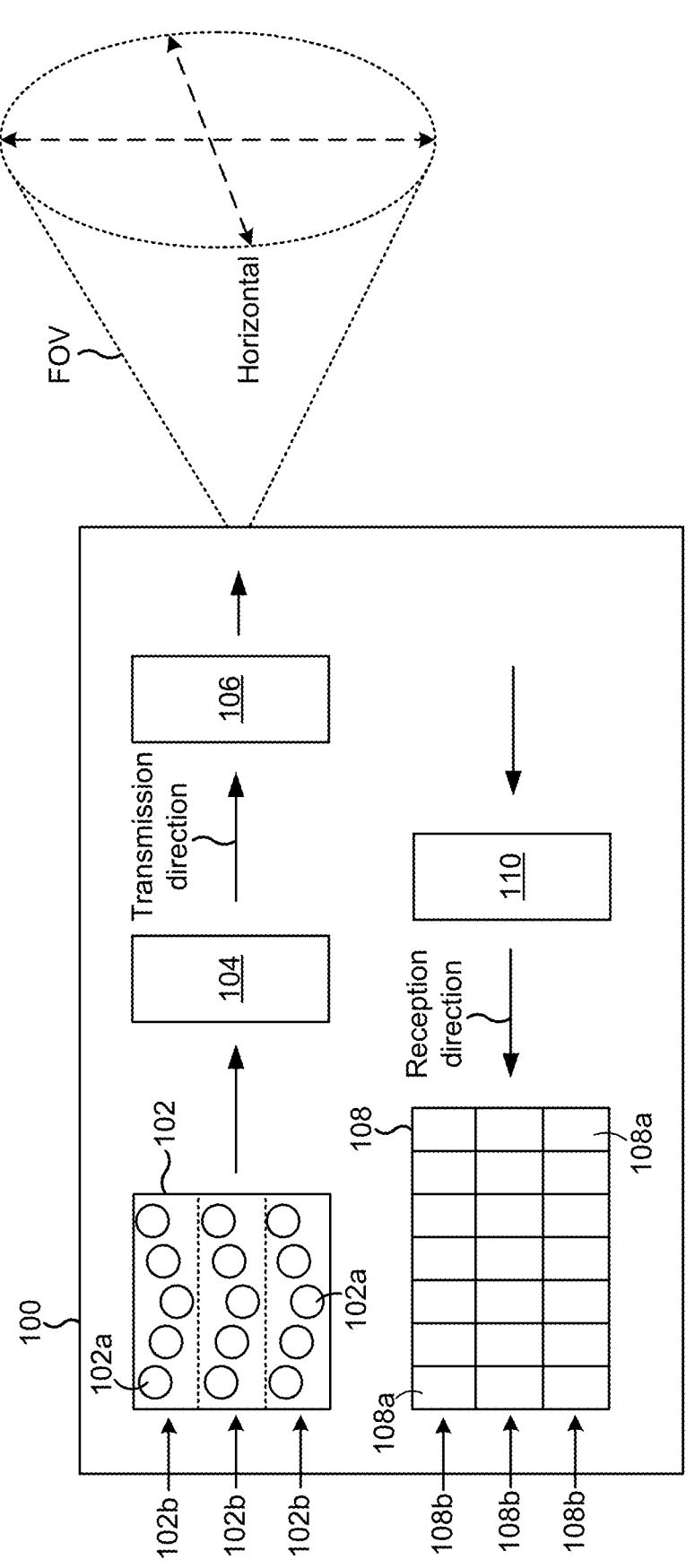
FIG. 1 is a diagram illustrating an example LIDAR system.

The following detailed description of example implementations refers to the accompanying drawings. The same reference numbers in different drawings may identify the same or similar elements.

In a LIDAR system, light returning from a field-of-view (FOV) of the LIDAR system may be measured in various ways. For example, the light may be collected by a two-dimensional (2D) image sensor array all at once (which may be referred to as a "global shutter"), or a 2D image sensor array may be scanned line-by-line of pixels (which may be referred to as "line readout") or in blocks of pixels (which may be referred to as "block readout"). Alternatively, mechanical rotating mirrors may be used to scan the FOV, and the image sensor may be a one-dimensional (1D) array of pixels or a single pixel.

In the case of a 2D image sensor, an aspect ratio of the image sensor array may be similar to the angular aspect ratio of the FOV of the LIDAR system. For example, an image sensor array with 300 horizontal pixels by 100 vertical pixels may be used to image an FOV of 120° in the horizontal and 40° in the vertical. That is, the ratio of horizontal to vertical is 3:1 in pixels, with respect to the image sensor array, and 3:1 in degrees with respect to the FOV.

The LIDAR system may employ a multi-channel emitter array (e.g., a multi-channel vertical cavity surface emitting laser (VCSEL) array) as a light source for scanning the FOV. In the multi-channel emitter array, rows of emitters of the emitter array may correspond to channels of the emitter array. The multi-channel emitter array may be powered-on one channel at a time, and the channels may be scanned from the top to the bottom of the emitter array. Line readout of the image sensor array may be synchronized with the light transmission of the emitter array. One or more lenses in front of the emitter array may be used to translate a channel length of the emitter array to the full horizontal FOV of the LIDAR system and to translate a channel width of the emitter array to a vertical resolution associated with the vertical FOV of the LIDAR system. Similarly, one or more lenses in front of the image sensor array may be used to translate reflected light from the FOV to the horizontal dimension and the vertical resolution of the image sensor array.

The emitter array may be matched to the aspect ratio of the image sensor array. For example, the emitter array may have the same aspect ratio as the image sensor array and/or the same dimensional size as the image sensor array.

Accordingly, an aspect ratio of individual rows or columns of the emitter array may be matched to an aspect ratio of individual rows or columns of the image sensor array. The image sensor array (e.g., a single-photon avalanche diode (SPAD) array) may have hundreds of pixels per row or per column. That is, the aspect ratio of a column or a row of the image sensor array may be relatively high.

As a result, an individual channel of the emitter array, matched to the aspect ratio of the image sensor array, may also have an aspect ratio that is relatively high. The high aspect ratio of the channel increases an electrical resistance of the channel, requiring additional voltage to drive the emitters of the channel and resulting in non-uniform voltage, and therefore illumination, at the emitters of the channel. Moreover, the high aspect ratio increases the overall form factor of the emitter array and the LIDAR system, as well as increases a manufacturing complexity of the emitter array.

Some implementations described herein provide an optical system (e.g., for a LIDAR system) that includes an emitter array, where an aspect ratio and/or a size of the emitter array is not constrained by an aspect ratio and/or a size of an image sensor array (e.g., a 2D emitter array). In some implementations, the optical system may additionally include an optical element, such as a lens, in front of the emitter array and a diffuser in front of the optical element. The diffuser may be configured to diffuse an optical power (e.g., light) from the emitter array in a lengthwise direction of a plurality of channels of the emitter array. For example, the diffuser may be configured to diffuse light across a horizontal field of view of the LIDAR system that includes the emitter array. Moreover, emitters of the emitter array may be arranged in a plurality of channels, and the respective positions of emitters of each channel may vary across a width of the channel (e.g., such that the entire width of the channel is sampled by the emitters).

In this way, the emitter array may match with the image sensor array and provide uniform illumination for the image sensor array, yet the emitter array may have a reduced size (e.g., relative to an emitter array that is size-matched to the image sensor array). Furthermore, this is achieved using an all-electronic approach for the emitter array that does not employ moving parts, such as mechanical rotating mirrors. The reduced size of the emitter array may decrease electrical resistance of the plurality of channels, thereby reducing a power gradient for emitters across a channel as well as reducing a drive voltage needed for the channel. Moreover, the emitter array may have a reduced form factor, thereby facilitating miniaturization of the LIDAR system.

FIG. 1 is a diagram illustrating an example LIDAR system 100. As shown in FIG. 1, the LIDAR system 100 may include a first optical system that includes an emitter array 102, an optical element 104, and a diffuser 106. The first optical system may be configured for light transmission of the LIDAR system 100 (e.g., for emitting light from the LIDAR system 100). In addition, the LIDAR system 100 may include a second optical system that includes an image sensor array 108 and an optical element 110. The second optical system may be configured for light reception of the LIDAR system 100 (e.g., for receiving light reflected to the LIDAR system 100). The LIDAR system 100, using the first optical system, may direct light toward one or more objects in an FOV of the LIDAR system 100.

The optical element 104 may be configured to receive light from the emitter array 102. For example, the optical element 104 may be positioned in front of the emitter array 102 in the transmission direction of the emitter array 102. That is, the optical element 104 may be positioned such that light emitted from the emitter array 102 passes through the optical element 104. The diffuser 106 may be configured to receive light from the optical element 104. For example, the diffuser 106 may be positioned in front of the optical element 104 in the transmission direction of the emitter array 102. That is, the diffuser 106 may be positioned such that light leaving the optical element 104 passes through the diffuser 106. In some implementations, the optical element 104 (e.g., a lens) may include diffractive optics. In some implementations, the optical element 104 and the diffuser 106 may be combined (e.g., mechanically combined) into a single component (e.g., a single part). For example, the optical element 104 may include a diffractive lens on (e.g., fabricated on) one side of a substrate, and the diffuser 106 may be on (e.g., fabricated on) an opposite side of the substrate of the diffractive lens.

The optical element 110 may be configured to provide light to the image sensor array 108. For example, the optical element 110 may be positioned in front of the image sensor array 108 in the reception direction of the emitter array 102. That is, the optical element 110 may be positioned such that light leaving the optical element 110 is directed onto the image sensor array 108.

The emitter array 102 may include a plurality of emitters 102a. For example, the emitter array 102 may be a VCSEL array that includes a plurality of VCSELs. In some implementations, the emitter array 102 may include a plurality of another type of vertically-emitting emitters, a plurality of edge-emitting emitters, or the like.

The plurality of emitters 102a may be arranged in a plurality of channels 102b of the emitter array 102. For example, a channel 102b of the emitter array 102 may correspond to a row of the emitter array 102, as shown. In some implementations, a channel 102b of the emitter array 102 may correspond to a column of the emitter array 102. Whether channels 102b of the emitter array 102 correspond to rows or columns of the emitter array 102 may be based on whether lines of the image sensor array 108 are read out by rows or by columns. The emitter array 102 may be configured to illuminate emitters 102a on a per-channel basis. That is, the emitter array 102 may be addressable in one dimension. For example, the emitter array 102 may be configured to illuminate emitters 102a of a first channel 102b (e.g., when an electrical current is supplied to the first channel 102b), illuminate emitters 102a of a second channel 102b (e.g., when an electrical current is supplied to the second channel 102b), and so forth, sequentially. The emitter array 102 may be configured to illuminate emitters 102a on a per-channel basis in order from a first channel 102b (e.g., a top channel 102b) to a last channel 102b (e.g., a bottom channel 102b) of the emitter array 102, at random, or the like.

The image sensor array 108 may include a plurality of pixels 108a (i.e., photodetection pixels) arranged in one or more rows and in one or more columns. For example, the image sensor array 108 may include a single-photon avalanche diode (SPAD) array or another type of photodetector array (e.g., employing another type of photodiode). The image sensor array 108 may be configured for readout by lines 108b (e.g., configured for line readout). That is, the plurality of pixels 108a may be read out from the image sensor array 108 line by line (e.g., row by row). A line 108b that is read out from the image sensor array 108 may correspond to a row or a column of the image sensor array 108. In some implementations, a sensor area of a pixel 108a may be a majority (e.g., equal to or greater than 90%, equal to or greater than 95%, or equal to or greater than 99%) of a total area of the pixel 108a (e.g., the sensor area is spread with a high fill factor over the pixel 108a). Additionally, or alternatively, a micro-lens associated with a pixel 108a may be configured to focus light on a sensor area (e.g., a relatively smaller sensor area) of the pixel 108a. In this manner, a macro-lens associated with a pixel 108a may effectively increase the sensitive area of the pixel 108a to a large fraction of the area of the pixel 108a.

An aspect ratio of the image sensor array 108 may match an aspect ratio of the FOV of the LIDAR system 100, as described herein. However, an aspect ratio of the emitter array 102 may not match an aspect ratio of the FOV of the LIDAR system 100. In some implementations, an aspect ratio of the image sensor array 108 may be different from an aspect ratio of the emitter array 102. For example, the aspect ratio of the emitter array 102 may be smaller than the aspect ratio of the image sensor array 108 (e.g., according to an x-dimension:y-dimension aspect ratio). In particular, a dimensional size (e.g., a length and/or a width) of the image sensor array 108 may be different from a dimensional size of the emitter array 102. For example, the dimensional size of the emitter array 102 may be smaller than the dimensional size of the image sensor array 108. As an example, a width of the emitter array 102 may be less than a width of the image sensor array 108.

The optical element 104 may include a lens (e.g., one or more lenses). The optical element 104 may be configured to direct light from the emitter array 102 across a vertical FOV (as shown) of the LIDAR system 100. That is, when channels 102b of the emitter array 102 are sequentially activated, the optical element 104 may alter the emission angle of the light by an amount corresponding to a vertical resolution of each line 108b (e.g., row) of the image sensor array 108. For example, if the image sensor array 108 has X vertical pixels, and the FOV of the LIDAR system 100 is Y° in the vertical, then a line 108b of the image sensor array 108 may receive light from a Y°÷X region of the FOV. Continuing with the example, when channels 102b of the emitter array 102 are sequentially activated, the optical element 104 (e.g., the lens) may alter the emission angle of the light by Y°÷X. In this way, power is conserved if the activated channel 102b on the emitter array 102 matches the vertical extent of the portion of the FOV being read by the image sensor array 108. In some implementations, for practical purposes (e.g., if a large number of channels would be needed), the emitter array 102 may use fewer channels 102b than the number of lines 108b on the image sensor array 108.

In some implementations, the optical element 104 may include, in addition or alternatively to the lens, a different optical element, such as a cylindrical lens for collimating light from the emitter array 102. The different optical element may be configured to have minimal effect on light from the emitter array 102 in the vertical, and may be configured to improve the sharpness of an output of the diffuser 106 at edges of the FOV.

The diffuser 106 may include a light diffuser. The diffuser 106 may provide one-dimensional light diffusion. For example, the diffuser 106 may be configured to diffuse light along a length of the plurality of channels 102b of the emitter array 102. As an example, the diffuser 106 may be configured to diffuse light in the horizontal (i.e., if the channels 102b of the emitter array 102 extend horizontally). In particular, the diffuser 106 may be configured to diffuse light over the horizontal FOV of the LIDAR system 100. In this way, while the aspect ratio of the emitter array 102 does not match with the aspect ratio of the FOV of the LIDAR system 100, the diffuser 106 may be configured to diffuse light (e.g., in the horizontal) from the emitter array 102 over the FOV of the LIDAR system 100 (e.g., the diffused light from the diffuser 106 defines the FOV of the LIDAR system 100 rather than the aspect ratio of the emitter array 102). Thus, an aspect ratio of the diffused light from the diffuser 106 may match the aspect ratio of the image sensor array 108.

The optical element 110 may include a lens (e.g., one or more lenses). The optical element 110 may be configured to direct light reflected from one or more objects in the FOV of the LIDAR system 100 to the image sensor array 108. For example, the optical element 110 may be configured to direct light originating from a particular channel 102b of the emitter array 102, and reflected from one or more objects in the FOV of the LIDAR system 100, to a corresponding line 108b of the image sensor array 108.

As indicated above, FIG. 1 is provided as an example. Other examples may differ from what is described with regard to FIG. 1.

Figure 2:
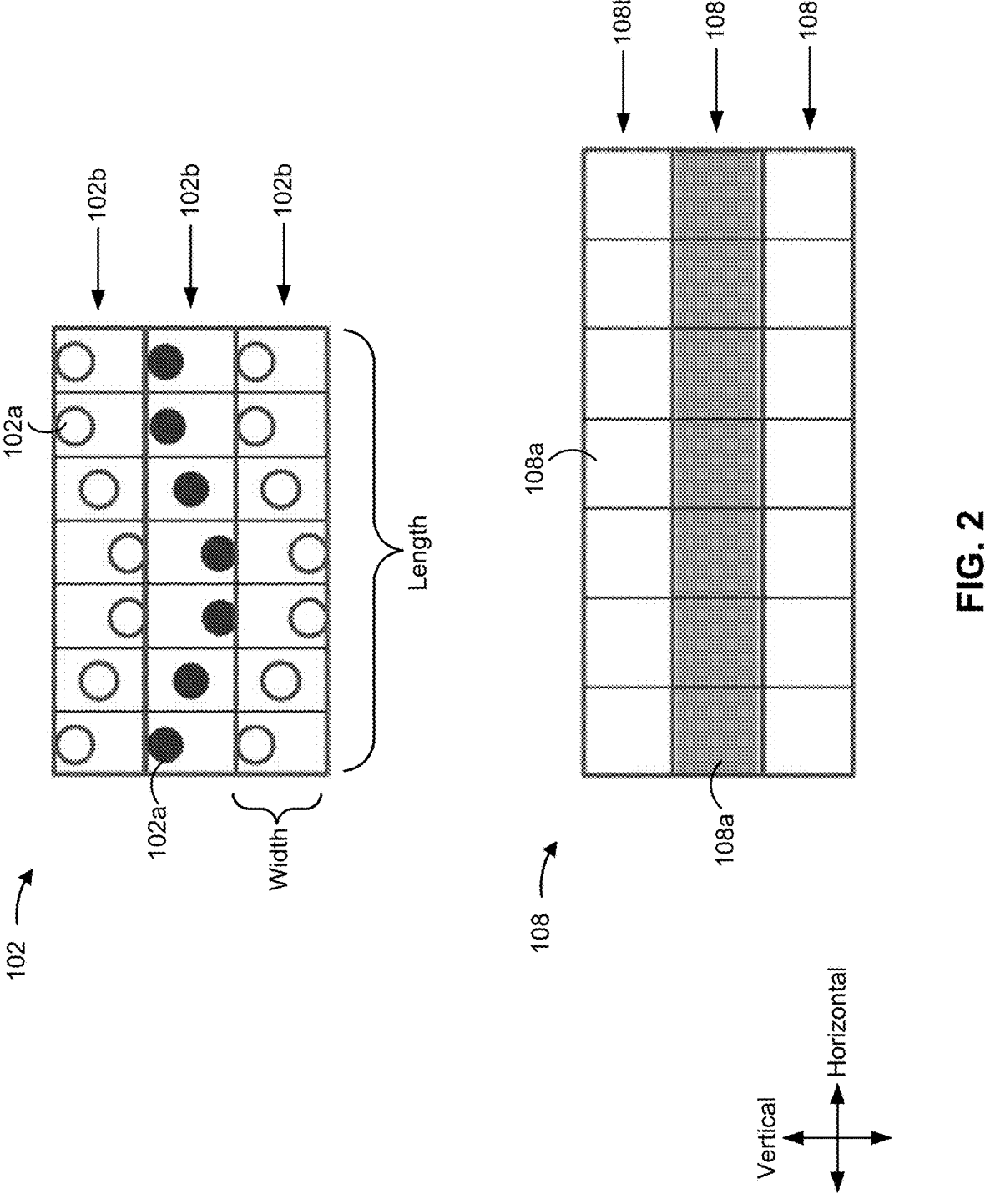
FIG. 2 is a diagram illustrating an example of an emitter array and an image sensor array of the LIDAR system of FIG. 1.

FIG. 2 is a diagram illustrating an example of the emitter array 102 and the image sensor array 108 of the LIDAR system 100. In particular, FIG. 2 shows a portion of the emitter array 102 and a portion of the image sensor array 108. As described herein, the plurality of emitters 102a of the emitter array 102 may be arranged in a plurality of channels 102b. As shown in FIG. 2, the plurality of channels 102b may correspond to horizontal rows of the emitter array 102. As further shown in FIG. 2, a channel 102b may be associated with a length (e.g., extending in the horizontal as shown in FIG. 2) and a width (e.g., extending in the vertical as shown in FIG. 2). For example, the width and the length of a channel 102b may define a 1×N (width×length) array of emitters 102a, where N is equal to or greater than 2. In some implementations, a channel spacing may be the same across the plurality of channels 102b. That is, each of the plurality of channels 102b may have the same width.

In some implementations, the respective positions of emitters 102a (e.g., emission regions of the emitters 102a, shown as circles in FIG. 2) of a channel 102b may vary across a width of the channel 102b. That is, the vertical positions of emitters 102a of a channel 102b may vary. For example, the vertical positions of emitters 102a of a channel 102b may vary such that an entire width (equal to or greater than 90%, equal to or greater than 95%, or equal to or greater than 99%, of the width) of the channel 102b has emitter-coverage, and such that light from the emitter array 102 passing through the diffuser 106 (shown in FIG. 1) results in full illumination of a corresponding line 108b (e.g., row) of the image sensor array 108 (as shown by the middle channel 102b of the emitter array 102 and the middle line 108b of the image sensor array 108 in FIG. 2). Here, "full illumination" may refer to equal to or greater than 90%, equal to or greater than 95%, or equal to or greater than 99% illumination of a pixel area of a line 108b of the image sensor array 108. In this way, even if a pixel of the line includes sub-pixels, all sub-pixels of the pixel receive light when the line is fully illuminated (e.g., so that one or more sub-pixels are able to sense light when another sub-pixel that has already received light is being reset and is unable to sense light). In some implementations, an emission region of one or more emitters 102a of a channel 102b may extend (e.g., slightly extend) beyond a boundary of the channel 102b (e.g., to compensate for an emission pattern of an emitter 102a not being a perfectly sharp top hat function).

In some implementations, the respective positions of emitters 102a of a channel 102b may vary according to a zig-zag pattern (e.g., a sawtooth pattern, a wave-like pattern, or the like). For example, multiple first emitters 102a (e.g., three emitters 102a, five emitters 102a, ten emitters 102a, or the like) of a channel 102b may be in an ascending pattern (e.g., angled in a first direction) relative to a width of the channel 102b, and multiple second emitters 102a of the channel 102b may be in a descending pattern (e.g., angled in a second direction) relative to the width of the channel 102b. The multiple first emitters 102a may be adjacent to the multiple second emitters 102a. Furthermore, multiple third emitters 102a of the channel 102b may be in the ascending pattern, and multiple fourth emitters 102a of the channel 102b may be in the descending pattern. The multiple third emitters 102a may be adjacent to the multiple fourth emitters 102a, and the multiple third emitters 102a may be between the multiple second emitters 102a and the multiple fourth emitters 102a.

In some implementations, the positions of emitters 102a (e.g., in the lowest positions of the pattern and/or the highest positions of the pattern) may be repeated throughout the pattern. For example, in one pattern, the positions of emitters 102a of a channel 102b may be according to the expression: channel width×(0.75, 0.5, 0.25, 0.25, 0.5, 0.75), where a successive value of the array is used for a successive emitter 102a of the channel 102b. In another pattern, the positions of emitters 102a of a channel 102b may be according to the expression: channel width×(0.8, 0.6, 0.4, 0.2, 0.2, 0.4, 0.6, 0.8, 0.8, 0.6, 0.4, 0.2), where a successive value of the array is used for a successive emitter 102a of the channel 102b. In this way, the positions used for the emitters 102a of a channel 102b may be sampled equally (e.g., the emitters 102a are positioned so that each emitter position is sampled the same number of times). The zig-zag pattern may repeat for one or multiple cycles in a channel 102b, where a cycle includes an ascending pattern and a descending pattern.

In some implementations, the respective positions of emitters 102a of a channel 102b may vary according to a continuous pattern or a blazed pattern. For example, multiple emitters 102a (e.g., three emitters 102a, five emitters 102a, ten emitters 102a, or the like) of a channel 102b may be in an ascending pattern or a descending pattern (e.g., angled) relative to a width of the channel 102b. For example, in one blazed pattern, the positions of emitters 102a of a channel 102b may be according to the expression: channel width×(0.2, 0.4, 0.6, 0.8, 0.2, 0.4, 0.6, 0.8), where a successive value of the array is used for a successive emitter 102a of the channel 102b. The continuous pattern or the blazed pattern may repeat for one cycle (e.g., in the case of the continuous pattern) or multiple cycles (e.g., in the case of the blazed pattern) in a channel 102b, where a cycle includes an ascending pattern or a descending pattern (e.g., all of the multiple cycles are ascending patterns or all of the multiple cycles are descending patterns).

In some implementations, the respective positions of emitters 102a of a channel 102b may vary in a pattern other than a pattern described herein, or may vary randomly or pseudo-randomly, provided that the positions are sampled equally.

The diffuser 106 used in combination with the emitter array 102, in which respective positions of emitters 102a of a channel 102b may vary across a width of the channel 102b, facilitates reduction of the size of the emitter array 102 (e.g., of a chip with the emitter array 102) relative to an emitter array that is sized to match the aspect ratio of the image sensor array 108. Notwithstanding (e.g., even if the emitter array 102 is similarly sized as the image sensor array 108), the flexibility of the aspect ratio of the emitter array 102 facilitates wider channels 102b that can more easily connect to driver circuitry, which generally requires a larger pitch between drive channels. Additionally, the wider channels 102b provide space for additional wire bonds to reduce inductance, reduce the complexity of the lens design, and increase the tolerance for optical misalignment during assembly. Furthermore, the emitter array 102 may be associated with a lower per-channel aspect ratio, thereby reducing electrical resistance of the channels 102b as well as reducing a voltage needed to drive the channels 102b and power gradients within the channels 102b. Accordingly, the emitter array 102 provides illumination with improved uniformity and coverage, thereby improving the manufacturability, the resolution, and the accuracy of the LIDAR system 100.

In some implementations, the diffuser 106 may be employed, as described herein, without an emitter array in which respective positions of emitters of a channel vary across a width of the channel. In some implementations, the emitter array 102, in which respective positions of emitters 102a of a channel 102b may vary across a width of the channel 102b, may be employed, as described herein, without the diffuser 106.

As indicated above, FIG. 2 is provided as an example. Other examples may differ from what is described with regard to FIG. 2.

Figure 3:
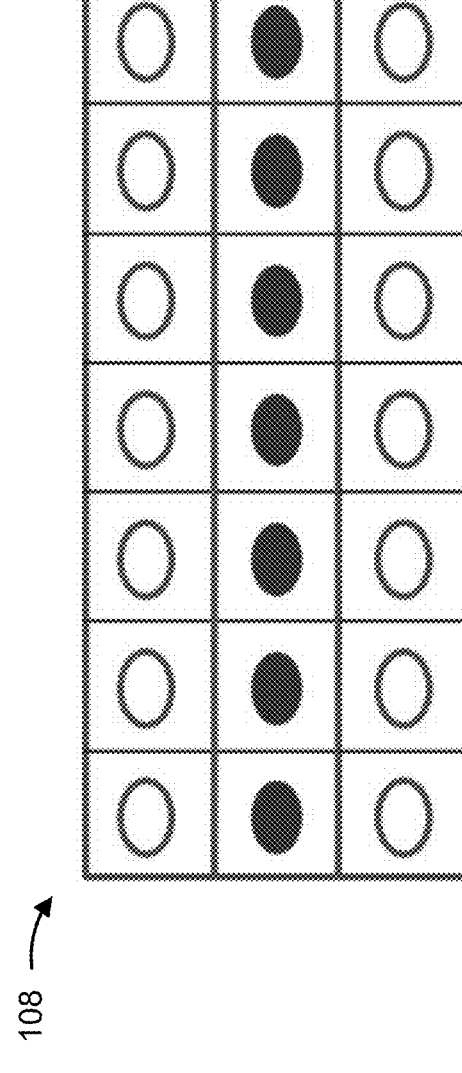
FIG. 3 is a diagram illustrating an example of an image sensor array of the LIDAR system of FIG. 1.
Figure 3:
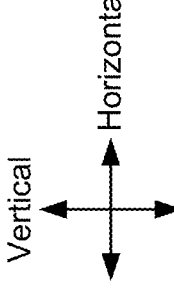

FIG. 3 is a diagram illustrating an example of the image sensor array 108 of the LIDAR system 100. In some implementations, the LIDAR system 100 may omit the diffuser 106. Here, for example, the optical element 104 (shown in FIG. 1) may include multiple (e.g., two) cross-cylindrical lenses, thereby resulting in an oval illumination pattern on the image sensor array 108 as shown in FIG. 3. For this oval illumination pattern, the number of emitters in a row of the emitter array 102 should match the number of sensor pixels of the image sensor array 108 in a row that receives illumination. Otherwise, some emitters may be imaged in between pixels of the image sensor array 108. The oval illumination pattern on the image sensor array 108 may produce distortion, which may be acceptable if the difference in the aspect ratios of the emitter array 102 and the image sensor array 108 is less than a threshold (e.g., a 1.5× difference in the aspect ratios).

In some implementations (e.g., when the LIDAR system 100 omits the diffuser 106), the optical element 104 may include a single cylindrical lens for reducing vertical light divergence, to thereby match a channel width of the emitter array 102 to a corresponding slice of the FOV of the LIDAR system 100 that is detected by one line (e.g., row) of the image sensor array 108. Here, light from the emitter array 102 may diverge in the horizontal direction without the use of the diffuser 106.

As indicated above, FIG. 3 is provided as an example. Other examples may differ from what is described with regard to FIG. 3.

Figure 4:
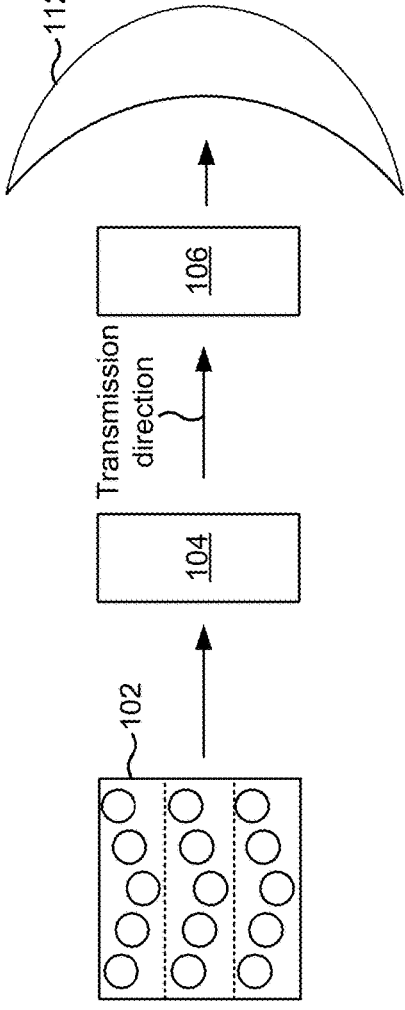
FIG. 4 is a diagram illustrating an example optical system.
Figure 4:
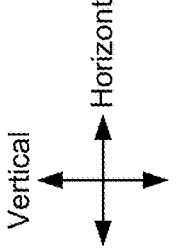

FIG. 4 is a diagram illustrating an example optical system 400. The optical system 400 may be used in the LIDAR system 100. As shown in FIG. 4, the optical system 400 may include the emitter array 102, the optical element 104, and the diffuser 106, as described herein. In addition, the optical system 400 may include a corrective optical element 112. The corrective optical element 112 may be positioned in front of the diffuser 106 in the transmission direction of the emitter array 102. That is, the corrective optical element 112 may be positioned such that light leaving the diffuser 106 passes through the corrective optical element 112.

The corrective optical element 112 may be configured to correct for distortion caused by the diffuser 106. A narrow field of illumination (e.g., less than 30 degrees) may not result in distortion. However, for a wider field of illumination, distortion may occur if projecting onto a flat screen rather than the inside of a hemisphere. For example, for a wider field of illumination, light passing through the optical element 104 and the diffuser 106 may tilt away from the horizontal, and the corrective optical element 112 may be configured to correct for such tilting. The corrective optical element 112 may be a refractive optical element. The corrective optical element 112 may have the shape of a hollow hemisphere. The corrective optical element 112 may be composed of a high-refractive-index material, such as a high-refractive-index plastic.

In some implementations, other embodiments may be employed to address wider fields of illumination and/or to increase the optical power that reaches a particular line of the image sensor array 108 (shown in FIG. 1). In some implementations, multiple emitter arrays 102 and respective optics (e.g., respective optical elements 104, diffusers 106, and/or corrective optical elements 112) may be configured to illuminate the same angular range (e.g., the same field of illumination). For example, two emitter arrays 102 and respective optics may both illuminate a particular FOV (e.g., a 120° by 45° FOV) to increase the optical power reaching the image sensor array 108. In some implementations, multiple emitter arrays 102 and respective optics may be configured to illuminate respective angular ranges of a field of illumination. For example, a field of illumination (e.g., a 120° by 45° field of illumination) may be split into two regions (e.g., two 60° by 45° regions), and two emitter arrays 102 and respective optics may respectively illuminate the two regions. In some implementations, an area of the emitter array 102 may be increased in order to increase the optical power into a particular line of the image sensor array 108, while reducing distortion, by configuring the emitter array 102 to illuminate a relatively narrower angular range, such as −60° to 0° and 0° to 60°, respectively, in the horizontal direction. In some implementations, the diffuser 106 associated with the emitter array 102 may be blazed, such that distortion is minimized for off-axis light (e.g., centered at 30° off-axis).

As indicated above, FIG. 4 is provided as an example. Other examples may differ from what is described with regard to FIG. 4.

While the description herein is described in terms of an image sensor array that is line readout row-by-row and an emitter array with channels that correspond to rows of the emitter array, the description herein is equally application to an image sensor array that is line readout column-by-column and an emitter array with channels that correspond to columns of the emitter array.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," "top," "bottom," "vertical," horizontal," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A light detection and ranging (LIDAR) system, comprising:
   a vertical cavity surface emitting laser (VCSEL) array comprising a plurality of VCSELs,
      wherein the plurality of VCSELs are arranged in a plurality of channels and each of the plurality of channels includes a separately addressable set of VCSELs configured to illuminate on a per-channel basis, and
      wherein respective positions of VCSELs, of the plurality of VCSELs, of a channel, of the plurality of channels, vary across a width of the channel;
   a first lens to receive light from the VCSEL array;
   a diffuser to receive light from the first lens,
      wherein the diffuser is configured to diffuse light along a length of the plurality of channels of the VCSEL array;
   an image sensor array configured for line readout,
      wherein an aspect ratio of the image sensor array is smaller than an aspect ratio of the VCSEL array; and
   a second lens to provide light to the image sensor array.

2. The LIDAR system of claim 1, wherein multiple first VCSELs, of the VCSELs of the channel, are in an ascending pattern relative to the width of the channel, and wherein multiple second VCSELs, of the VCSELs of the channel, are in a descending pattern relative to the width of the channel.

3. The LIDAR system of claim 1, wherein multiple VCSELs, of the VCSELs of the channel, are in an ascending pattern or in a descending pattern relative to the width of the channel.

4. The LIDAR system of claim 1, wherein the diffuser provides one-dimensional diffusion.

5. The LIDAR system of claim 1, wherein the aspect ratio of the image sensor array is matched to an aspect ratio of a field of view of the LIDAR system, wherein the aspect ratio of the VCSEL array is not matched to the aspect ratio of the field of view of the LIDAR system, and wherein the diffuser is configured to diffuse light from the VCSEL array over the field of view of the LIDAR system.

6. The LIDAR system of claim 1, further comprising: a corrective optical element to receive light from the diffuser and to correct distortion.

7. The LIDAR system of claim 1, wherein the image sensor array is a single-photon avalanche diode (SPAD) array.

8. An optical system, comprising:

an emitter array comprising a plurality of emitters, wherein the plurality of emitters are arranged in a plurality of channels and each of the plurality of channels includes a separately addressable set of emitters configured to illuminate on a per-channel basis, wherein an aspect ratio of the emitter array is not matched to and less than an aspect ratio of a field of view of the optical system, and wherein respective positions of emitters, of the plurality of emitters, of a channel, of the plurality of channels, vary across a width of the channel;

a lens to receive light from the emitter array;

a diffuser to receive light from the lens, wherein the diffuser is configured to diffuse light along a length of the plurality of channels of the emitter array; and a corrective optical element to receive light from the diffuser and to correct distortion.

9. The optical system of claim 8, wherein the diffuser provides one-dimensional diffusion.

10. The optical system of claim 8, wherein the diffuser is configured to diffuse light from the emitter array over the field of view of the optical system.

11. The optical system of claim 8, wherein the corrective optical element is configured to correct distortion caused by the diffuser.

12. The optical system of claim 8, wherein the corrective optical element is a refractive optical element.

13. The optical system of claim 8, wherein multiple first emitters, of the emitters of the channel, are in an ascending pattern relative to the width of the channel, and wherein multiple second emitters, of the emitters of the channel, are in a descending pattern relative to the width of the channel.

14. The optical system of claim 8, wherein multiple emitters, of the emitters of the channel, are in an ascending pattern or in a descending pattern relative to the width of the channel.

15. The optical system of claim 8, wherein the plurality of emitters of the emitter array are a plurality of vertical cavity surface emitting lasers.

16. A vertical cavity surface emitting laser (VCSEL) device, comprising:

a VCSEL array comprising a plurality of VCSELs, wherein the plurality of VCSELs are arranged in a plurality of channels and each of the plurality of channels includes a separately addressable set of VCSELs configured to illuminate on a per-channel basis, and wherein respective positions of VCSELs, of the plurality of VCSELs, of a channel, of the plurality of channels, vary across a width of the channel such that multiple adjacent first VCSELs, of the VCSELs of the channel, are in an ascending pattern relative to the width of the channel, and multiple adjacent second VCSELs, of the VCSELs of the channel, are in a descending pattern relative to the width of the channel; and an image sensor array configured for line readout, wherein an aspect ratio of the image sensor array is lower than an aspect ratio of the VCSEL array.

17. The VCSEL device of claim 16, wherein the multiple first VCSELs are adjacent to the multiple second VCSELs.

18. The VCSEL device of claim 16, further comprising: a lens to receive light from the VCSEL array; and a diffuser to receive light from the lens, wherein the diffuser is configured to diffuse light along a length of the plurality of channels of the VCSEL array.

19. The VCSEL device of claim 18, further comprising: a corrective optical element configured to correct distortion caused by the diffuser.

20. The VCSEL device of claim 18, wherein the diffuser provides one-dimensional diffusion.

* * * * *